(12) United States Patent
Jang et al.

(10) Patent No.: US 7,682,449 B2
(45) Date of Patent: Mar. 23, 2010

(54) HETEROSTRUCTURE SEMICONDUCTOR NANOWIRES AND METHOD FOR PRODUCING THE SAME

(75) Inventors: Eun Joo Jang, Daejeon-Si (KR); Shin Ae Jun, Seongnam-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/835,778

(22) Filed: Aug. 8, 2007

(65) Prior Publication Data

US 2008/0168943 A1    Jul. 17, 2008

Related U.S. Application Data

(62) Division of application No. 11/358,510, filed on Feb. 21, 2006, now abandoned.

(30) Foreign Application Priority Data

Feb. 22, 2005 (KR) .................. 10-2005-0014461
Nov. 28, 2005 (KR) .................. 10-2005-0114068

(51) Int. Cl.
*C30B 25/00* (2006.01)
*C30B 28/12* (2006.01)

(52) U.S. Cl. ............... 117/87; 117/54; 117/86; 117/89; 117/95; 117/103; 117/104; 977/718; 977/768; 977/773; 977/784; 977/790; 977/827

(58) Field of Classification Search .......... 117/54, 117/86, 87, 89, 95, 103, 104; 977/718, 768, 977/773, 784, 790, 827

See application file for complete search history.

(56) References Cited

U.S. PATENT DOCUMENTS

| | | | | |
|---|---|---|---|---|
| 7,179,561 B2* | 2/2007 | Niu et al. | ............ | 429/44 |
| 7,265,037 B2* | 9/2007 | Yang et al. | ............ | 438/497 |
| 7,303,628 B2* | 12/2007 | Alivisatos et al. | ............ | 117/86 |
| 7,374,807 B2* | 5/2008 | Parce et al. | ............ | 428/76 |
| 7,557,367 B2* | 7/2009 | Rogers et al. | ............ | 257/9 |
| 7,597,950 B1* | 10/2009 | Stellacci et al. | ............ | 428/144 |
| 2004/0005723 A1* | 1/2004 | Empedocles et al. | ............ | 438/1 |
| 2004/0095658 A1* | 5/2004 | Buretea et al. | ............ | 359/853 |
| 2006/0185578 A1* | 8/2006 | Jang et al. | ............ | 117/68 |
| 2008/0168943 A1* | 7/2008 | Jang et al. | ............ | 117/54 |
| 2009/0087493 A1* | 4/2009 | Dai et al. | ............ | 424/490 |
| 2009/0226520 A1* | 9/2009 | Stirbl et al. | ............ | 424/484 |
| 2009/0227162 A1* | 9/2009 | Kruckenberg et al. | ............ | 442/1 |
| 2009/0239338 A1* | 9/2009 | Zhou et al. | ............ | 438/108 |

* cited by examiner

*Primary Examiner*—Robert M Kunemund
*Assistant Examiner*—G. Nagesh Rao
(74) *Attorney, Agent, or Firm*—Cantor Colburn, LLP

(57) ABSTRACT

Disclosed herein are heterostructure semiconductor nanowires. The heterostructure semiconductor nanowires comprise semiconductor nanocrystal seeds and semiconductor nanocrystal wires grown in a selected direction from the surface of the semiconductor nanocrystal seeds wherein the semiconductor nanocrystal seeds have a composition different from that of the semiconductor nanocrystal wires. Further disclosed is a method for producing the heterostructure semiconductor nanowires.

7 Claims, 5 Drawing Sheets

US 7,682,449 B2

HETEROSTRUCTURE SEMICONDUCTOR NANOWIRES AND METHOD FOR PRODUCING THE SAME

This non-provisional application claims priority to U.S. patent application Ser. No. 11/358,510 filed on Feb. 21, 2006, now abandoned which claims priority under 35 U.S.C. §119(a) to Korean Patent Application Nos. 2005-14461 and 2005-114068 filed on Feb. 22, 2005 and Nov. 28, 2005, respectively, which are hereby incorporated in their entirety by reference.

BACKGROUND OF THE INVENTION

1. Field of the Invention

The present invention relates to heterostructure semiconductor nanowires and a method for producing the nanowires. More particularly, the present invention relates to heterostructure semiconductor nanowires comprising semiconductor nanocrystal seeds and semiconductor nanocrystal wires grown in a selected direction from the surface of the semiconductor nanocrystal seeds wherein the semiconductor nanocrystal seeds have a composition that is different from that of the semiconductor nanocrystal wires. The present invention also relates to a method for producing the nanowires.

2. Description of the Related Art

Semiconductor nanocrystals produced by wet chemical processes can be utilized in microstructural devices due to their small size. In addition, the inherent characteristics of semiconductor nanocrystals can be controlled due to quantum confinement effects and the like, and as a result, various electrooptical properties can be induced and utilized. As a result, semiconductor nanocrystals have received a great deal of attention.

In particular, nanocrystals in the form of rods or wires advantageously afford the possibility of being able to use mobility characteristics of electrons in a particular direction along with the associated optical properties in that direction. For example, such nanocrystals can be used to induce a polarization phenomenon in microstructural devices in which they are employed. Much research has been conducted to synthesize such nanocrystals.

In this connection, Japanese Patent Laid-open No. 14-220300 teaches a method for producing nanowires comprising the steps of depositing microcrystalline silicon particles on the surface of a silicon substrate and heating the substrate to a temperature at which the surface of the silicon substrate is melted under a vacuum. The heating step generates surface segregation on the crystal surface of the microcrystalline silicon particles to allow a plurality of nanowires to grow thereon.

The problems of this method, however, are that both steps are carried out on the substrate using vapor deposition thereby causing an increase in production costs.

Further, Korean Patent Laid-open No. 2004-000418 proposes a nanowire comprising a first segment of a substantially crystalline material and a second segment of a material having a composition different from that of the first segment and joined to the first segment wherein at least one segment of the first and second segments has a substantially uniform diameter of less than approximately 200 nm. This patent publication discloses nanowires having two or more structures and suggests the possibility of using the nanowires in various applications.

However, although the patent publication proposes the basic concept regarding the structure of the nanowire, it fails to disclose detailed production processes, i.e., a process for controlling the reactivity of the second segment. Further, Japanese Patent Laid-open No. Hei 15-277029 introduces a method for manufacturing carbon nanotubes by disposing a nanocarbon material on a substrate and selectively growing carbon nanotubes almost perpendicular to the substrate. This patent publication is highly distinguished from the present invention in terms of the final products and processes employed.

Japanese Patent Laid-open No. Hei 16-122283 introduces a method for manufacturing a nanometer-sized microstructure comprising the steps of forming a material layer on a substrate, forming a pattern on the material layer using pyramidal particles, depositing a metal catalyst on the patterned material layer, peeling the material layer to form a patterned metal catalyst, and growing the patterned metal catalyst into a crystal. This patent publication is highly distinguished from the present invention in terms of the final products and processes employed.

SUMMARY OF THE INVENTION

To meet the above technical needs, it is desirable to manufacture heterostructure semiconductor nanowires whose diameter can be easily controlled and that has improved optical and electrical properties.

It is also desirable to provide a method for producing the heterostructure semiconductor nanowires.

In accordance with one aspect of the present invention, there are provided heterostructure semiconductor nanowires comprising semiconductor nanocrystal seeds and semiconductor nanocrystal wires formed in a selected direction from the surface of the semiconductor nanocrystal seeds wherein the semiconductor nanocrystal seeds have a composition different from that of the semiconductor nanocrystal wires.

In accordance with another aspect of the present invention, there is provided a method for producing nanowires initiated from a semiconductor nanocrystal which comprises (a) preparing semiconductor nanocrystal seeds, (b) adding the nanocrystal seeds to a metal precursor solution of nanocrystal wires, and (c) adding a non-metal precursor solution of the nanocrystal wires to the mixture obtained (b) to allow the precursors to react with each other, thereby forming the nanocrystal wires on the nanocrystal seeds.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail.

The present invention is directed to heterostructure semiconductor nanowires comprising semiconductor nanocrystal seeds and semiconductor nanocrystal wires formed in a selected direction from the surface of the semiconductor nanocrystal seeds wherein the semiconductor nanocrystal seeds have a composition different from that of the semiconductor nanocrystal wires.

Hybrid nanowires that have hitherto been known have a complex structure consisting of a metal catalyst and silicon. However, hybrid nanowires composed of different semiconductor materials, which are features of the present invention, have not yet been reported. If nanowires are composed of different semiconductor materials bonded to each other with different valence bands and conduction bands, as in the present invention, separation of electrons and holes can be efficiently induced, which makes it possible to apply the nanowires to a variety of devices. Such devices generally make use of photoelectric properties of the nanowires. Examples of such devices are photodetectors.

Specific examples of materials constituting the nanocrystal seeds or the nanocrystal wires are Group II-VI, Group III-V, Group IV-VI semiconductor compounds, and mixtures thereof. The heterostructure semiconductor nanowires of the present invention are characterized in that the constituent material of the nanocrystal seeds is different from that of the nanocrystal wires. If the nanocrystal seeds and the nanocrystal wires are composed of the same material, separation of electrons and holes using a difference in energy bands is not induced. Accordingly, heterostructure semiconductor nanowires composed of different materials show electrooptical properties superior to those of semiconductor nanowires composed of the same materials.

More specific examples of materials constituting the nanocrystal seeds or the nanocrystal wires that can be used in the present invention include, but are not limited to, CdS, CdSe, CdTe, ZnS, ZnSe, ZnTe, HgS, HgSe, HgTe, PbS, PbSe, PbTe, InP, GaP, TiP, and mixtures thereof.

The shapes of the nanocrystal seeds can be selected from the group consisting of platelet-like, cylindrical, spherical, ellipsoidal, cuboid, polygonal, or the like, or a combination comprising at least one of the foregoing shapes.

The size of the nanocrystal seeds may be varied in the range of 1 nm to 50 nm, depending on the specification of the nanowires to be produced. This size range of the nanocrystal seeds enables control of electrooptical properties due to quantum confinement effects, unlike larger bulky materials.

The semiconductor nanowires of the present invention can be applied in various industrial fields, such as displays, sensors, energy devices and semiconductors, and particularly are useful in energy and semiconductor industries, such as photodetectors using photoelectric properties, photovoltaic cells and optical memory devices.

Figure 1:
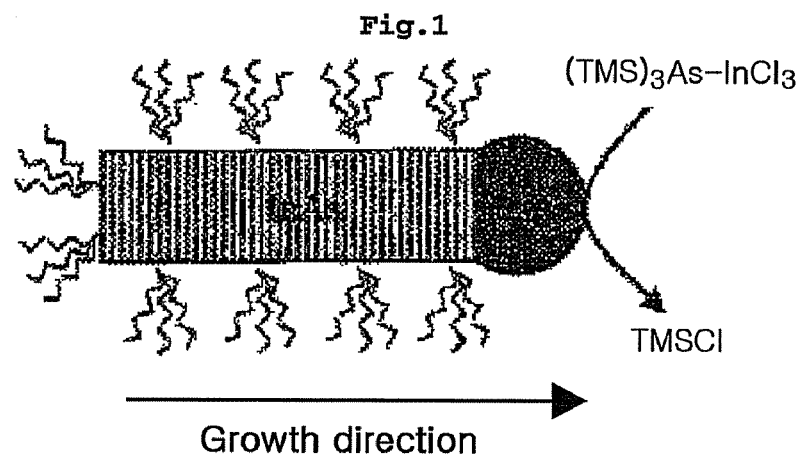
FIG. 1 is a schematic diagram of an InAs nanowire using a gold nanoparticle as a catalyst in accordance with the prior art.
Figure 2:
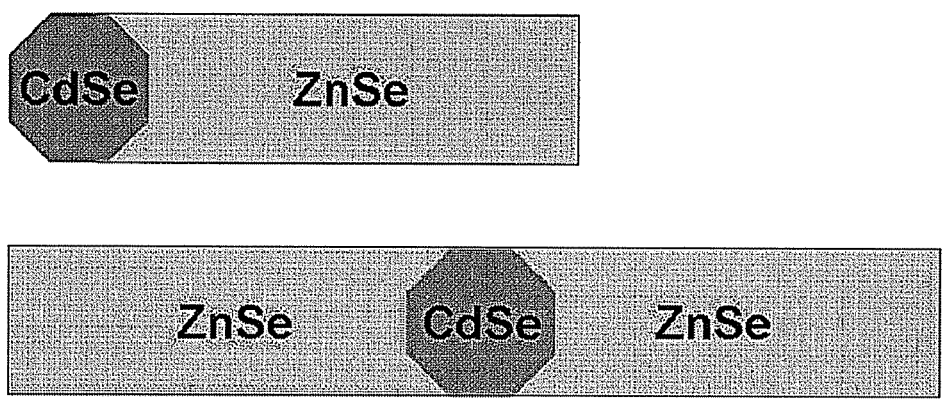
FIG. 2 schematically shows ZnSe nanocrystal wires initiated from CdSe nanoparticles according to one embodiment of the present invention.

The present invention is also directed to a method for producing heterostructure semiconductor nanowires initiated from a semiconductor nanocrystal. A conventional technique for producing InAs nanorods using gold nanoparticles is known (see, FIG. 1). In contrast, the semiconductor nanowires of the present invention are initiated from semiconductor nanocrystal seeds (see, FIG. 2), instead of metal catalysts. The method of the present invention is characterized in that the size and characteristics of the semiconductor nanowires can be induced from the characteristics of the seeds.

According to the method of the present invention, the nanocrystal wires are grown from the active surface of the seeds. Accordingly, the nanocrystal wires can be grown at a lower concentration at lower temperatures. The diameter of the nanocrystal wires growing on particular surfaces of the seeds can be controlled by controlling the size of the seeds.

Unlike the conventional technique that uses metal nanoparticles, growth points of the nanocrystal wires become distant from the seeds as the nanocrystal wires are grown on the surface of the seeds. This is a characteristic difference between the present invention and the conventional technique. This growth of the nanocrystal wires using the seeds provides an advantage that the diameters of the nanocrystal wires can be more easily controlled when compared to nanowires produced by a process that does not employ any nanocrystal seeds, in which one kind material is grown by controlling the kind of a surfactant, the concentration of a precursor or the reaction temperature. Another advantage is that various materials can be designed by combining the characteristics of the seeds and the nanocrystal wires.

The method of the present invention will be explained in more detail based on the respective steps.

(a) Step of Preparing Nanocrystal Seeds

Nanocrystal seeds used in the method of the present invention can be prepared, for example, in accordance with the following procedure. After cadmium oxide is mixed with a solvent (e.g., trioctyl amine) and a dispersant (e.g., oleic acid), the reaction temperature is raised to 300° C. in a nitrogen atmosphere. Subsequently, a Se/trioctyl phosphine solution is rapidly added to the reaction mixture, followed by rapid cooling to prepare the nanocrystal seeds.

Examples of suitable nanocrystals that can be used as the seeds in the method of the present invention include Group II-VI, Group III-V and Group IV-VI semiconductor compounds, and the like, and a combination comprising at least one of the foregoing semiconductor compounds.

Specific constituent materials of the seeds include, but are not limited to, CdS, CdSe, CdTe, ZnS, ZnSe, ZnTe, HgS, HgSe, HgTe, PbS, PbSe, PbTe, InP, GaP, TiP, and the like, and a combination comprising at least one of the foregoing semiconductor compounds.

The shapes of the nanocrystal seeds can be selected from the group consisting of platelet-like, cylindrical, spherical, ellipsoidal, cuboid, polygonal, and the like, and a combination comprising at least one of the foregoing shapes.

The size of the nanocrystal seeds may be varied in the range of 1 nm to 50 nm, depending on the specification of the nanowires to be produced. This size range of the nanocrystal seeds enables control of electrooptical properties due to quantum confinement effects.

According to the method of the present invention, since the kind, shape and size of the material for the seeds are controlled to grow the nanocrystal wires on a particular surface of the seeds, the reactivity between the seeds and the nanocrystal wires can be controlled depending on the surface characteristics of the seeds. In addition, the formation of defects on the surface of the seeds in the initial stage of the growth of the nanocrystal wires can be reduced, leading to an improvement in luminescence efficiency. Furthermore, since separation of electrons and holes is facilitated as the growth of the nanocrystal wires proceeds, the mobility of electrons can be improved despite the possibility of low luminescence efficiency.

The nanocrystal seeds can be separated by common techniques, such as centrifugation. Transmission electron microscopy (TEM) is employed to evaluate the optical properties and to analyze the size and shape of the separated nanocrystal seeds.

(b) Step of Adding the Nanocrystal Seeds to Metal Precursor Solution of Nanocrystal Wires First, zinc acetate is mixed with a solvent (e.g., trioctyl amine) and a dispersant (e.g., oleic acid) to create a mixture. After the mixture is heated to 300° C. in a nitrogen atmosphere, a solution comprising the nanocrystal seeds prepared in step (a) in an appropriate solvent (e.g., toluene) is rapidly added to thereto.

Specific examples of metal precursors that can be used in the method of the present invention include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, indium sulfate, and the like, and a combination comprising at least one of the foregoing metal precursors.

(c) Step of Adding Non-Metal Precursor Solution of the Nanocrystal Wires to the Mixture Obtained in Step (b) to Allow the Precursors to React with Each Other, Thereby Forming the Nanocrystal Wires on the Nanocrystal Seeds In this step, a non-metal precursor solution of the nanocrystal wires, such as a Se/trioctyl phosphine (TOP) solution, is slowly added to the mixture prepared in step (b) to allow the precursors to react with each other, completing the production of the final nanowires.

Specific examples of non-metal precursors that can be used in the method of the present invention include, but are not limited to, alkyl thiol compounds, such as hexane thiol, octane thiol, decane thiol, dodecane thiol, hexadecane thiol and mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, sellenium-trioctylphosphine (Se-TOP), sellenium-tributylphosphine (Se-TBP), sellenium-triphenylphosphine (Se-TPP), tellurium-tributylphosphine (Te-TBP), tellurium-triphenylphosphine (Te-TPP) and trimethylsilyl phosphine, alkyl phosphines, including triethylphosphine, tributylphosphine, trioctylphosphine, triphenylphosphine and tricyclohexylphosphine, arsenic oxide, arsenic chloride, arsenic sulfate, arsenic bromide, arsenic iodide, nitric oxide, nitric acid, ammonium nitrate, and the like, and a combination comprising at least one of the foregoing non-metal precursors.

The concentrations of the metal precursor and the non-metal precursor can be controlled in proportion to the concentration of the nanocrystal seeds. As the concentration of the seeds increases, the length of the nanocrystal wires is likely to decrease. In addition, the growth rate and crystallinity of the nanocrystal wires may depend on the characteristics of the crystalline surface of the seeds.

Specifically, the nanocrystal wires can be epitaxially grown on the crystalline surface of the nanocrystal seeds. The nanocrystal seeds are included in a portion of the nanocrystal wires. The concentration ratio of the nanocrystal seeds to the precursors of the nanocrystal wires is preferably in the range of about 0.01:1 to about 1:0.01.

Hereinafter, the present invention will be explained in more detail with reference to the following examples. However, these examples are given for the purpose of illustration and are not to be construed as limiting the scope of the invention.

Example 1

Figure 3:
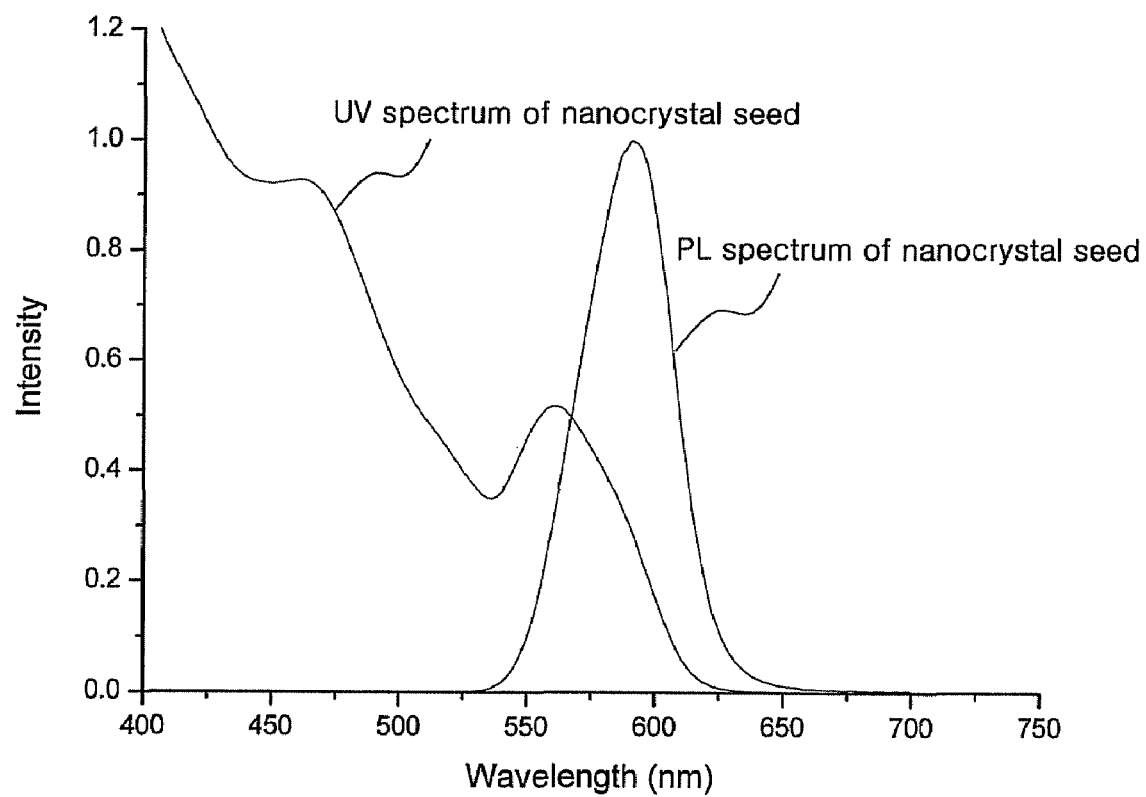
FIG. 3 is a graph showing UV and photoluminescence (PL) spectra of CdSe nanocrystal seeds prepared in Example 1 of the present invention.

Preparation of CdSe Nanocrystal Seeds 1.6 mmol of cadmium oxide (CdO) and 3.2 mmol of oleic acid were added to 20 ml of trioctyl amine (TOA) in a 250 ml round flask equipped with a heating mantle. The mixture was heated to 150° C. with stirring under a vacuum. The flask was purged with nitrogen three times at 150° C. and heated to 300° C. with stirring. 1 ml of a 0.2M Se/trioctyl phosphine (TOP) solution was rapidly added to the mixture at 300° C. After 1.5 minutes of the reaction, the mantle was removed to rapidly lower the reaction temperature, followed by addition of a low-boiling point solvent, e.g., ethanol. Centrifugation of the mixture produced a precipitate. The precipitate was dispersed in 5 ml of an organic solvent (e.g., toluene) to prepare CdSe nanocrystals. Ultraviolet (UV) and photoluminescence (PL) spectra of the CdSe nanocrystal are shown in FIG. 3. UV and PL spectroscopy data revealed that the CdSe nanocrystal has a maximum absorption wavelength of about 560 nm and a maximum emission wavelength of about 590 nm.

Example 2

Preparation of ZnSe Nanocrystal Wires Using the CdSe Nanocrystal Seeds 0.4 mmol of zinc acetate and 0.8 mmol of oleic acid were sequentially added to 20 ml of TOA in a 250 ml round flask. The mixture was heated to 150° C. while stirring under a vacuum. The flask was purged with nitrogen about three times at 150° C. and heated to 300° C. with stirring. 1 ml of the solution of the CdSe nanocrystal seeds prepared in Example 1 was rapidly added to the flask at 300° C. After 1 ml of a 0.2M Se/TOP solution was slowly added to the flask, the reaction was allowed to proceed for one hour to prepare nanocrystal wires.

Figure 4:
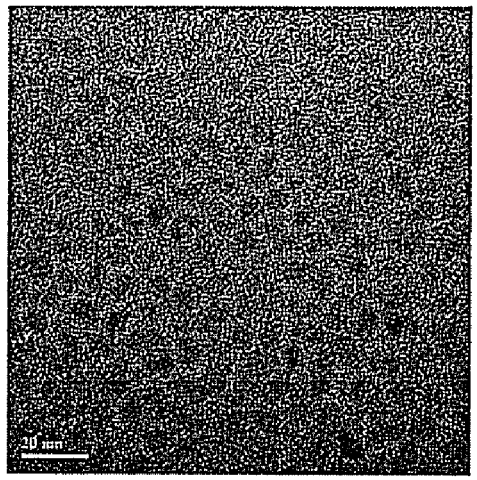
FIG. 4 shows transmission electron microscope (TEM) images of CdSe—ZnSe nanowires produced in Example 2 of the present invention at different reaction times.
Figure 4:
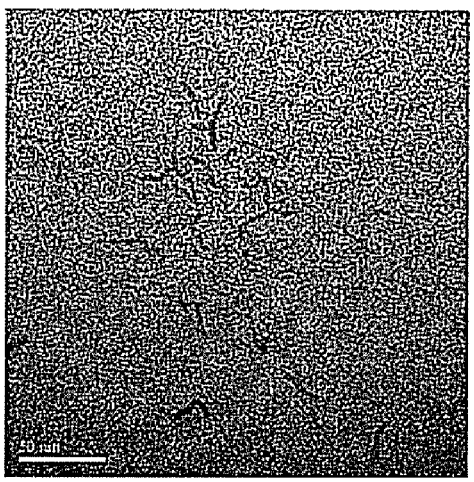
Figure 4:
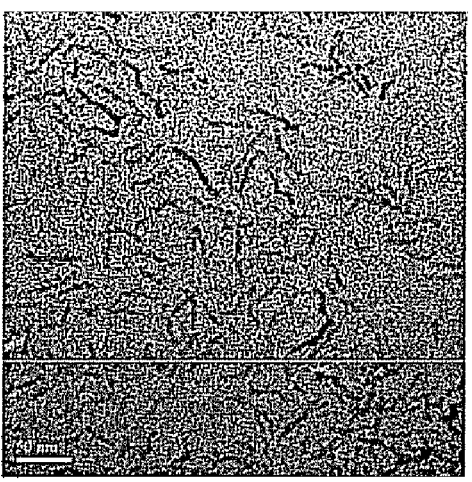

Samples were drawn from the flask every 20 minutes during the reaction. Analysis by electron microscopy confirmed that the length of the wires is increased with the passage of time (see, the images shown in FIG. 4).

Figure 5:
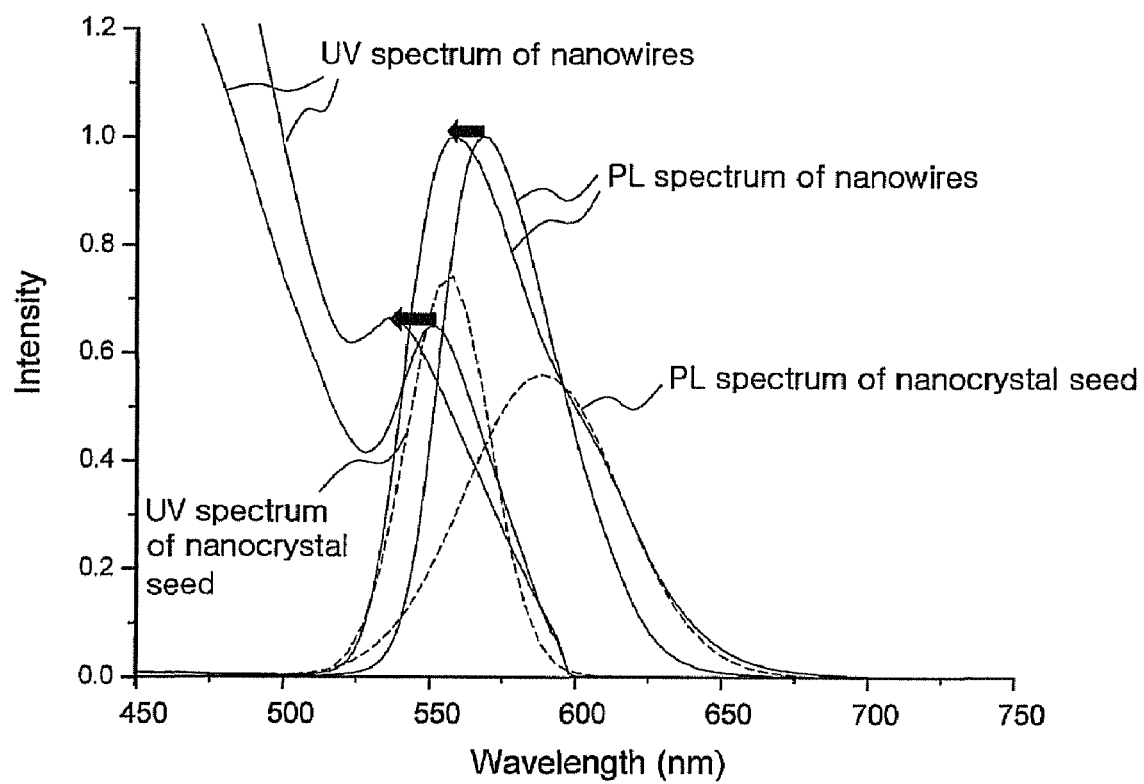
FIG. 5 is a graph showing UV and PL spectra of CdSe—ZnSe nanowires produced in Example 2 of the present invention.

FIG. 5 is a graph showing UV and PL spectra of the CdSe—ZnSe nanowires at different reaction times, together with the UV and PL spectra of the CdSe nanocrystal seeds. It can be seen from the graph that as the ZnSe is grown on the CdSe nanocrystal seeds, the maximum absorption wavelength is blue-shifted from 550 nm to 538 nm but the point at which the absorption starts remains unchanged due to the presence of the low energy bandgap of ZnSe. In addition, the photoluminescence spectrum shows that as the ZnSe is grown on the CdSe nanocrystal seeds, the maximum emission wavelength is blue-shifted from 568 nm to 558 nm but the initial emission wavelength (590 nm) of the nanocrystal seeds is still observed.

Example 3

Control of Diameter of ZnSe Nanocrystal Wires Using CdSe Nanocrystal Seeds

Figure 6:
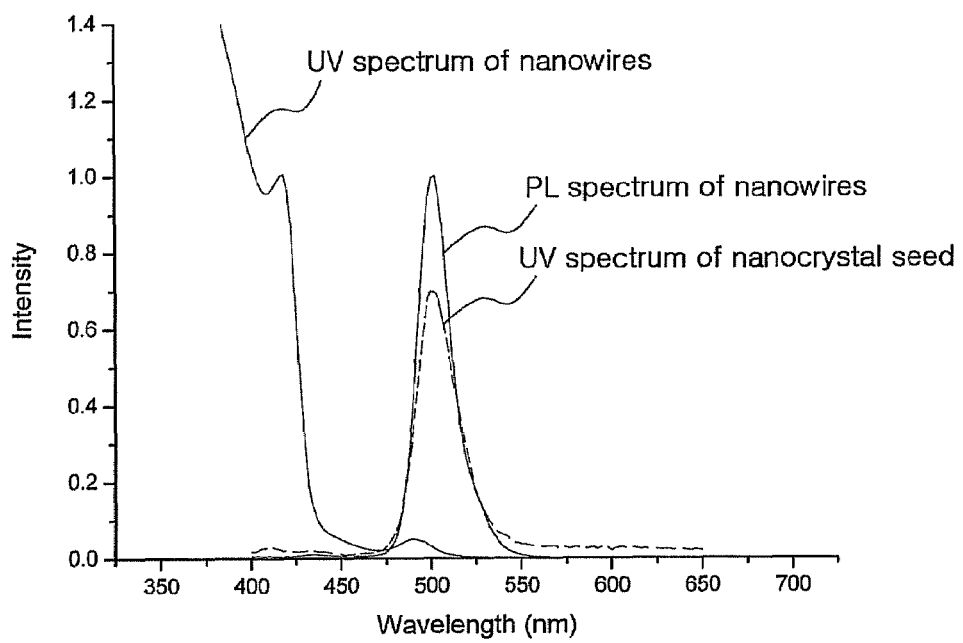
FIG. 6 is a graph showing UV and PL spectra of CdSe—ZnSe nanowires produced in Example 3 of the present invention.

A CdSe nanocrystal was prepared in the same manner as in Example 1, except that 1 ml of a 2.0M Se/TOP was added and the reaction time was shortened to 30 seconds. Thereafter, the nanocrystal was separated by the same process as in Example 1, and dispersed in 5 ml of toluene. The absorption spectrum of the CdSe nanocrystal indicates a maximum absorption wavelength of 500 nm (see, FIG. 6).

The nanocrystal was used as seeds and was allowed to react under the same conditions as those employed in Example 2 to produce CdSe—ZnSe nanowires. UV and PL spectroscopy data revealed that the CdSe—ZnSe nanowires have a maximum absorption wavelength of about 418 nm and a maximum emission wavelength of about 502 nm (See, FIG. 6). It can be seen from the graph shown in FIG. 6 that the maximum absorption wavelength is blue-shifted from 500 nm to 418 nm, confirming the formation of the nanowires.

Figure 7:
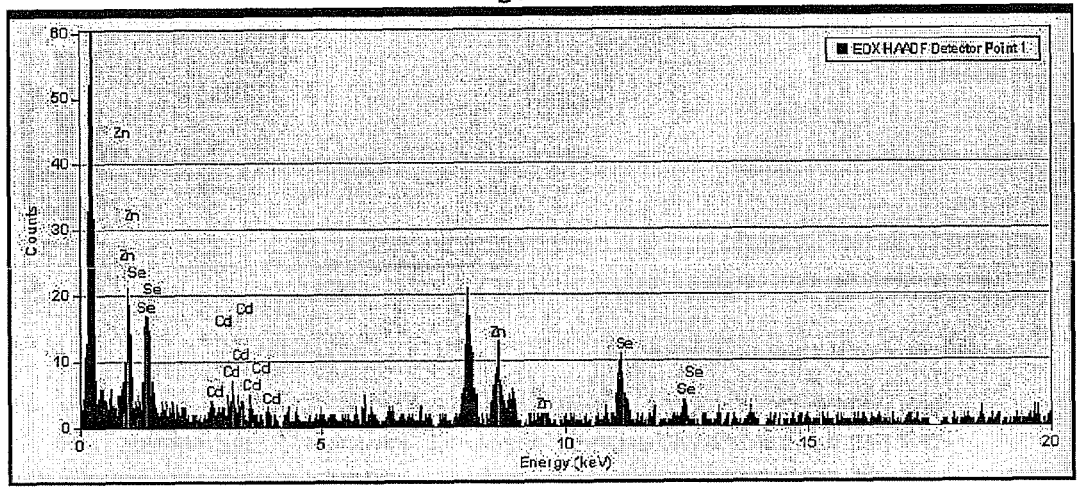
FIG. 7 is a graph showing energy dispersive spectroscopy (EDS) of CdSe—ZnSe nanowires produced in Example 3 of the present invention.

Energy dispersive spectroscopy (EDS) analysis of the CdSe—ZnSe nanowires was conducted, and the obtained analytical data are shown in FIG. 7. The data show the detection of cadmium (Cd), zinc and selenium, which confirms the formation of a heterostructure in which the nanocrystal wires are grown on the seeds.

As apparent from the foregoing, according to the present invention, the direction of nanocrystal wires grown on nanocrystal seeds can be controlled using the difference in the activity of the crystal surface of the nanocrystal seeds, and the diameter of the nanocrystal wires can be controlled by controlling the size of the seeds.

In addition, when the nanocrystal wires are grown on the surface of the nanocrystal seeds, the luminescence efficiency can be improved or the mobility of electrons can be increased as the reaction proceeds. The nanowires of various structures composed of two or more materials have improved emission or absorption properties, exhibit polarization properties due to their orientation, and facilitate migration of electrons and holes. Therefore, the nanowires of the present invention can be applied to a variety of optoelectronic devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for producing a nanowire initiated from a semiconductor nanocrystal, the method comprising the steps of (a) preparing a semiconductor nanocrystal seed, (b) adding the nanocrystal seed to a metal precursor solution of a nanocrystal wire, and (c) adding a non-metal precursor solution of the nanocrystal wire to the mixture obtained in step (b) to allow the precursors to react with each other, and forming the nanocrystal wire on the nanocrystal seed, wherein the concentration ratio of the nanocrystal seed to the precursors of the nanocrystal wire is in the range of 0.01:1 to 1:0.01, wherein a surfactant exists on the surface of the semiconductor nanocrystal seed and the semiconductor nanocrystal wire, and the surfactant is a carboxylic acid surfactant, and wherein the nanocrystal seed prepared in step (a) has a shape selected from the group consisting of platelet, spherical, ellipsoidal, cuboid, and a combination comprising at least one of the foregoing shapes.

2. The method according to claim 1, wherein the nanocrystal seed prepared in step (a) is composed of a material selected from the group consisting of Group II-VI, Group III-V, Group IV-VI semiconductor compounds, and mixtures thereof.

3. The method according to claim 1, wherein the nanocrystal seed prepared in step (a) has a size of 1 nm to 50 nm.

4. The method according to claim 1, wherein the metal precursor used in step (b) is selected from the group consisting of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, indium sulfate, and a combination comprising at least one of the foregoing metal precursors.

5. The method according to claim 1, wherein the non-metal precursor used in step (c) is selected from the group consisting of alkyl thiol compounds, including hexane thiol, octane thiol, decane thiol, dodecane thiol, hexadecane thiol and mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP) and trimethylsilyl phosphine, alkyl phosphines, including triethylphosphine, tributylphosphine, trioctylphosphine, triphenylphosphine and tricyclohexylphosphine, arsenic oxide, arsenic chloride, arsenic sulfate, arsenic bromide, arsenic iodide, nitric oxide, nitric acid, ammonium nitrate and a combination comprising at least one of the foregoing non-metal precursors.

6. The method according to claim 1, wherein in step (c) the nanocrystal wire is epitaxially grown on the crystal surface of the nanocrystal seed.

7. The method according to claim 1, wherein the nanocrystal seed is included in a portion of the nanocrystal wire.

* * * * *